United States Patent
Dinc et al.

(10) Patent No.: US 6,393,076 B1
(45) Date of Patent: May 21, 2002

(54) DECODING OF TURBO CODES USING DATA SCALING

(75) Inventors: Abdulkadir Dinc, Jersey City, NJ (US); Frederic M. Fontaine, New York, NY (US)

(73) Assignee: Motorola, Inc., Schaumburg, IL (US)

(*) Notice: Subject to any disclaimer, the term of this patent is extended or adjusted under 35 U.S.C. 154(b) by 10 days.

(21) Appl. No.: 09/686,575

(22) Filed: Oct. 11, 2000

(51) Int. Cl.[7] .................. H03D 1/00; H04L 27/06
(52) U.S. Cl. .................................. 375/341
(58) Field of Search .................. 375/341, 316, 375/340; 714/794, 795

(56) References Cited

U.S. PATENT DOCUMENTS

| | | | |
|---|---|---|---|
| 5,173,879 A | * 12/1992 | Cung et al. | 367/21 |
| 5,949,796 A | * 9/1999 | Kumar | 370/487 |
| 6,067,327 A | * 5/2000 | Creigh et al. | 341/144 |
| 6,145,114 A | * 11/2000 | Crozier et al. | 704/200 |
| 6,307,901 B1 | * 10/2001 | Yu et al. | 375/233 |

OTHER PUBLICATIONS

Hagenauer et al., "Iterative Decoding of Binary Block and Convolutional Codes", IEEE Trans. Inf. Theory, vol. 42, Mar. 1996, pp. 429–445.

Viterbi, A., "An Intuitive Justification and a Simplified Implementation of the MAP Decoder for Convolution Codes", IEEE Journal of Select. Areas Commun., vol. 16, No. 2, Feb. 1998, pp. 260–264.

Bahl et al., "Optimal Decoding of Linear Codes for Minimizing Symbol Error Rate", IEEE Trans. Inform. Theory, vol. IT–20, Mar. 1974, pp. 284–287.

\* cited by examiner

*Primary Examiner*—Stephen Chin
*Assistant Examiner*—Lenny Jiang
(74) *Attorney, Agent, or Firm*—Brian M. Mancini

(57) ABSTRACT

A method 100 for improved decoding of received convolutionally coded input data uses data scaling to provide near ideal turbo decoding. The method includes a first step of loading 102 a portion of the input data into a buffer. A next step includes calculating 104 a mean of the data in the portion of the input data. A next step includes computing 106 a root-mean-square value of the portion of the input data using the mean from the calculating step. A next step includes deriving 108 a scaling factor from the root-mean-square value of the computing step, and a next step includes scaling 110 the portion of input data by the scaling factor of the deriving step.

12 Claims, 7 Drawing Sheets

— PRIOR ART —

— PRIOR ART —

— PRIOR ART —

— PRIOR ART —

DECODING OF TURBO CODES USING DATA SCALING

FIELD OF THE INVENTION

This invention relates generally to communication systems, and more particularly to decoding in a receiver of a convolutionally coded communication system.

BACKGROUND OF THE INVENTION

Convolutional codes are often used in digital communication systems to protect transmitted information from error. Such communication systems include the Direct Sequence Code Division Multiple Access (DS-CDMA) standard IS-95 and the Global System for Mobile Communications (GSM) and future CDMA2000 systems. Typically in these systems, a signal is convolutionally coded into an outgoing code vector that is transmitted. At a receiver, a practical soft-decision decoder, such as a Viterbi decoder as is known in the art, uses a trellis structure to perform an optimum search for the maximum likelihood transmitted code vector.

More recently, turbo codes have been developed that outperform conventional coding techniques. Turbo codes are generally composed of two or more convolutional codes and turbo interleavers. Turbo decoding is iterative and uses a soft output decoder to decode the individual convolutional codes. The soft output decoder provides information on each bit position which helps the soft output decoder decode the other convolutional codes. The soft output decoder is usually a MAP (maximum a posteriori) or soft output Viterbi algorithm (SOVA) decoder.

Turbo coding is efficiently utilized to correct errors in the case of communicating over an added white Gaussian noise (AWGN) channel. Intuitively, there are a few ways to examine and evaluate the error correcting performance of the turbo decoder. One observation is that the magnitude of log-likelihood ratio (LLR) for each information bit in the iterative portion of the decoder increases as iterations go on. This improves the probability of the correct decisions. The LLR magnitude increase is directly related to the number of iterations in the turbo decoding process. The rate of increase of the LLR magnitude varies as the quality of the incoming signal and the resulting number of errors incurred therein. In other words, the rate of increase of the LLR magnitude is related to channel conditions, where a more noisy environment increases error.

Prior art methods for improving turbo coder performance include scaling the channel outputs of the turbo decoder by an estimate of the channel characteristics. However, this scaling is only useful for the next set of data to be decoded and not for the data from which the channel estimate is derived. This problem is compounded where channel conditions are variable. In addition, an inaccurate estimate will yield sever performance degradation.

There is a need for an improvement that does not rely on channel estimation as a base for scaling. In addition, it would be of benefit to provide correction to existing data instead of using information from the existing data to correct subsequent data as is done in the prior art. Moreover, it would be beneficial to provide the improvement without an increase in calculation complexity, hardware requirements, or cost.

DETAILED DESCRIPTION OF THE PREFERRED EMBODIMENT

The present invention eliminates channel estimation and replaces it by providing turbo decoding using maximum probability values and root-mean-square (RMS) values of frame data which is applied to inputs of a turbo decoder. The scaling of data is more of a real-time function than channel estimation and provides lower errors than in the prior art. Advantageously, this improvement eliminates the more complicated channel estimation calculations of the prior art, and is easily implemented using simpler hardware conserving power in the communication device and saving calculation complexity.

Figure 1:
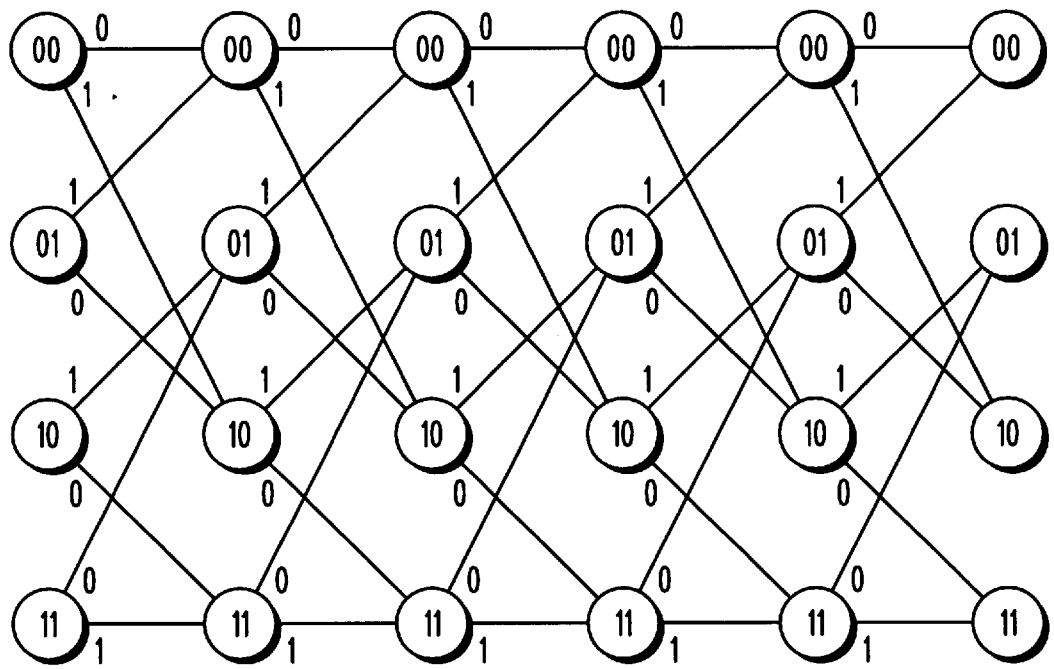
FIG. 1 shows a trellis diagram used in soft output decoder techniques as are known in the prior art.

Typically, block codes, convolutional codes, turbo codes, and others are graphically represented as a trellis as shown in FIG. 1, wherein a four state, five section trellis is shown. Maximum a posteriori type decoders (log-MAP, MAP, max-log-MAP, constant-log-MAP, etc.) utilize forward and backward generalized Viterbi recursions or soft output Viterbi algorithms (SOVA) on the trellis in order to provide soft outputs at each section, as is known in the art. The MAP decoder minimizes the decoded bit error probability for each information bit based on all received bits.

Because of the Markov nature of the encoded sequence (wherein previous states cannot affect future states or future output branches), the MAP bit probability can be broken into the past (beginning of trellis to the present state), the present state (branch metric for the current value), and the future (end of trellis to current value). More specifically, the MAP decoder performs forward and backward recursions up to a present state wherein the past and future probabilities are used along with the present branch metric to generate an output decision. The principles of providing hard and soft output decisions are known in the art, and several variations of the above described decoding methods exist. Most of the soft input-soft output (SISO) decoders considered for turbo codes are based on the prior art optimal MAP algorithm in a paper by L. R. Bahl, J. Cocke, F. Jelinek, and J. Raviv entitled "Optimal Decoding of Linear Codes for Minimizing Symbol Error Rate", IEEE Transactions on Information Theory, Vol. IT-20, March 1974, pp. 284–7 (BCJR algorithm).

Figure 2:
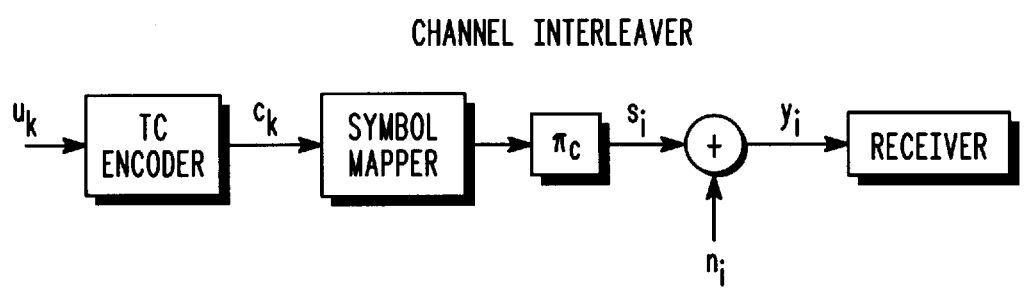
FIG. 2 shows a simplified block diagram for a baseband communication system as is known in the art.

For simplicity and without loss of generality, we consider a digital equivalent baseband communication system depicted in FIG. 2, where the information sequence $u_k$ is turbo encoded, mapped to channel symbols $s_i$ which is either 1 or −1, passed through a channel interleaver $\pi_c$ and transmitted over a fading channel where added white Gaussian noise (AWGN) $n_i$ introduces itself. Distortion due to AWGN increases the likelihood of bit errors when a receiver attempts to decode the signal to obtain the original information bits $u_k$. The use of turbo decoding alone in the receiver will reduce, but not eliminate, bit errors due to the AWGN channel.

Figure 3:
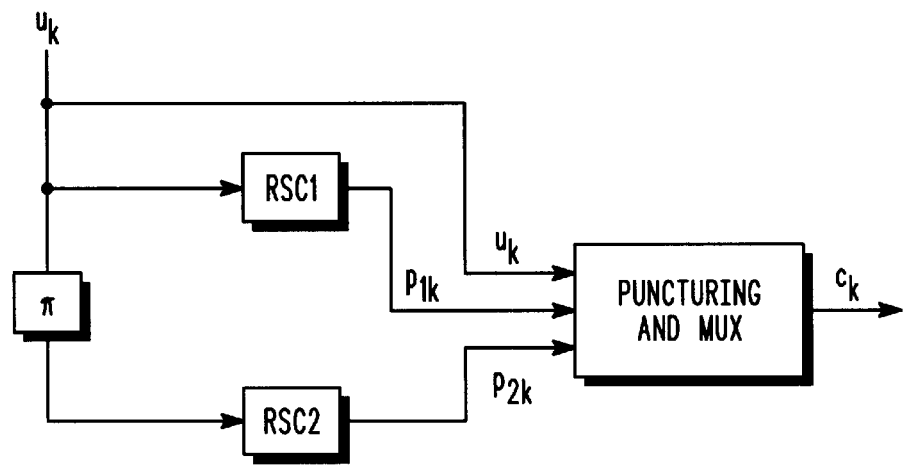
FIG. 3 shows a simplified block diagram for a turbo encoder as is known in the art.

FIG. 3 shows a typical turbo coder that is constructed with interleavers and constituent codes which are usually systematic convolutional codes, but can be block codes also. In general, a turbo encoder is a parallel concatenation of two recursive systemic convolutional encoders (RSC) with an interleaver π between them. However, this invention can be easily apply to other forms of turbo codes such as ones with more than two constituent codes and ones with serial concatenated convolutional codes (SCCC). The output of the turbo encoding is generated by multiplexing (concatenating) the information bits $u_k$ and the parity bits $p_i$ from the two encoders, RSC1 and RSC2. Optionally, the parity bits can be punctured as is known in the art to increase code rate. In general, the number of parity bits of the RSC can be more than one. However, the present invention can be easily applied to all other cases where the RSC has more than one parity bit. The turbo encoded signal is then transmitted over a channel. Noise, $n_i$, due to the AWGN nature of the channel becomes added to the signal, $y_i$, during transmission. The noise increases the likelihood of bit errors when a receiver attempts to decode the input signal, $y_i(=s_i+n_i)$, to obtain the original information bits $u_k$. Correspondingly, noise also affects the transmitted parity bits.

Figure 4:
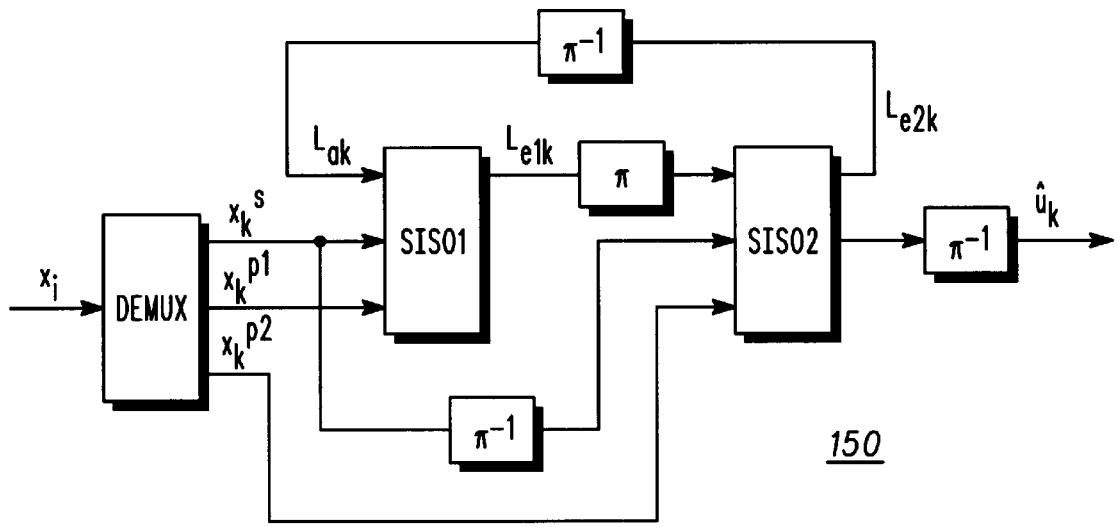
FIG. 4 shows a simplified block diagram for a turbo decoder as is known in the art.

FIG. 4 shows a typical turbo decoder that is constructed with interleaver, de-interleavers, and decoders. Considering an AWGN corrupted signal, denoted as $x_i$, the mechanism of the turbo decoder regarding extrinsic information $L_{e1k}$, $L_{e2k}$, interleaver π, de-interleaver $π^{-1}$, and the iteration process between the soft-input, soft-output decoder sections SISO1 and SISO2 follow the BCJR algorithm. In general, the input signal is channel-deinterleaved and applied to a demultiplexer to separate the samples corresponding to information bits and coded bits. Assuming zero decoder delay in the turbo decoder, the first decoder (SISO1) computes a soft output from the samples $x_k^s$ for information bits, and $x_k^{p1}$, for first coded bits and the a priori information ($L_{ak}$). The soft output is denoted as $L_{e1k}$, for extrinsic information from the first decoder. The second decoder (SISO2) is input with interleaved versions of $L_{e1k}$ (the a priori information for SISO2), the interleaved samples $x_k^s$, for information bits, and $x_k^{p2}$, for second coded bits. The second decoder generates extrinsic information, $L_{e2k}$, which is deinterleaved to produce $L_{ak}$ which is fed back to the first decoder. The above iteration is repeated for a predetermined number of times. Then a soft output (typically a log-likelihood ratio (LLR)) which provides an estimate of the original information bits $u_k$ is generated. For simplicity, a slicer is included, as is known in the art, inside the SISO2 decoder such that the decoder final output is a hard decision about $u_k$, which is denoted by $\hat{u}_k$.

MAP algorithms minimize the probability of error for an information bit given the received sequence, and they also provide the probability that the information bit is either a 1 or 0 given the received sequence. The prior art BCJR algorithm provides a soft output decision for each bit position (trellis section of FIG. 1) wherein the influence of the soft inputs within the block is broken into contributions from the past (earlier soft inputs), the present soft input, and the future (later soft inputs). The BCJR decoder algorithm uses a forward and a backward generalized Viterbi recursion on the trellis to arrive at an optimal soft output for each trellis section (stage). These a posteriori probabilities, or more commonly the log-likelihood ratio (LLR) of the probabilities, are passed between SISO decoding steps in iterative turbo decoding. The LLR for each information bit u, conditioned on a matched filter output is $$L(u|y) = \log\frac{P(u=+1|y)}{P(u=-1|y)} \quad (1)$$
$$= \log\frac{P(y|u=+1)}{P(y|u=-1)} + \log\frac{P(u=+1)}{P(u=-1)}$$

For a transmission over a Gaussian channel with fading, the log-likelihood can be further expanded as:

$$L(u|y) = \log\frac{\exp\left(-\frac{E_s}{N_0}(y-\alpha)^2\right)}{\exp\left(-\frac{E_s}{N_0}(y+\alpha)^2\right)} + \log\frac{P(u=+1)}{P(u=-1)} \quad (2)$$
$$= L_c \cdot y + L(u)$$

where L(u) corresponds to the a priori knowledge of the value of u, independently of the channel observations. The term $L_c \cdot y$ corresponds to the scaled channel outputs. The channel estimate $L_c$ has the following expression:

$$L_c 4\alpha \cdot E_s/N_0 \quad (3)$$

For a fading channel, α corresponds to the fading amplitude, $E_s$ is the signal energy per bit, and $N_0$ is the noise power density. For a Gaussian channel, α is equal to 1. In a turbo decoding structure, after the first iteration, u is replaced with the extrinsic information Le provided by the other constituent decoder.

Figure 5:
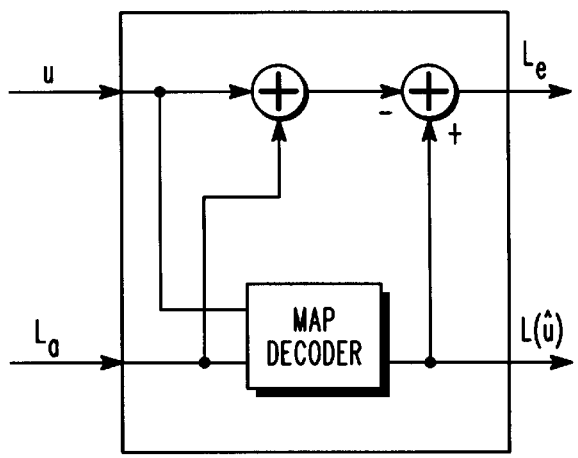
FIG. 5 shows a simplified block diagram for a SISO decoder.

The structure of the constituent SISO decoder is shown in FIG. 5 (with parity bit inputs eliminated for clarity). The extrinsic information $L_e$ is generated using the following equation:

$$L_e = L(\hat{u}) - (L_a + u) \quad (4)$$

Obviously, the computation of accurate extrinsic information requires detailed knowledge of the channel characteristic $L_a$. As the MAP decoder uses a trellis structure (shown in FIG. 1) whose branch metrics are very dependent on the channel soft values, any incorrect knowledge of the channel estimate $L_a$ might result in severe performance degradation. Therefore, determining a proper scaling of the soft channel values is an important operation in turbo decoding.

Traditionally, the SISO decoders used in turbo decoding are MAP decoders implementing the BCJR algorithm, or a logarithmic version of it. The goal of a MAP decoder is to compute the soft value:

$$L(\hat{u}) = \log\frac{P(u_k=+1|y)}{P(u_k=-1|y)} \quad (5)$$
$$= \log\frac{\sum_{\substack{(s',s) \\ u_k=+1}} p(s',s,y)}{\sum_{\substack{(s',s) \\ u_k=-1}} p(s',s,y)}$$

The sum of joint probabilities p(s',s,y) at the numerator or at the denominator is taken over all transitions in the trellis from state s' to state s, labeled with the information bit $u_k$=+1 or with $u_k$=−1, respectively. In case of memoryless transition, the joint probabilities can be further expanded:

$$p(s', s, y) = p(s', y_{j<k}) \cdot p(s, y_k | s') \cdot p(y_{j>k} | s) \quad (6)$$

$$= \alpha_{k-1}(s') \cdot \gamma_k(s', s) \cdot \beta_k(s)$$

The probability that a decoded bit is equal to 1 (or 0) in the trellis given the received sequence is composed of a product of terms due to the Markov property of the code. The Markov property states that the past and the future are independent given the present. The present, $\gamma_k$, is the probability of being in state s' at time k and generating the symbol $\gamma_k$ when the previous state at time k−1 was s. The present plays the function of a branch metric. The past, $\alpha_k$, is the probability of being in state s' at time k with the received sequence $\{y_1, \ldots, y_k\}$, and the future, $\beta_k$, is the probability of generating the received sequence $\{y_{k+1}, \ldots, y_N\}$ from state s at time k. The probability $\alpha_k$ can be expressed as function of $\alpha_{k-1}(s')$ and $\gamma_k(s',s)$ and is called the forward recursion. The probability $\beta_{k-1}(s')$ can be expressed as function of $\beta_k(s)$ and $\gamma_k(s',s)$ and is called the backward recursion. The forward and backward recursion are therefore expressed $$\alpha_k(s) = \sum_{s'} \alpha_{k-1}(s') \cdot \gamma_k(s', s) \quad (7)$$

$$\beta_{k-1}(s') = \sum_s \beta_k(s) \cdot \gamma_k(s', s)$$

For each existing transition in the trellis between states s' and s at a given stage k, the branch transition probability is computed as follows:

$$\gamma_k(s', s) \propto \exp\left(\frac{1}{2}\sum_{j=1}^{2} L_c y_{k,j} x_{k,j} + \frac{1}{2} u_k (L_c y_{k,0} + L(u_k))\right) \quad (8)$$

Unfortunately, this equation, as well as the two recursions, involves many floating-point operations. To simplify the algorithm, a novel approach is to replace every sum of exponentials with its leading term using the following approximation:

$$\ln \sum_j \exp(a_j) \approx \max_j a_j \quad (9)$$

Equation 5 can then be rewritten:

$$L(\hat{u}_k) = \log \frac{\sum_{\substack{(s',s)\\u_k=+1}} p(s', s, y)}{\sum_{\substack{(s',s)\\u_k=-1}} p(s', s, y)} \quad (10)$$

$$= \log \sum_{\substack{(s',s)\\u_k=+1}} \alpha_{k-1}(s') \cdot \gamma_k(s', s) \cdot \beta_k(s) - \log \sum_{\substack{(s',s)\\u_k=-1}} \alpha_{k-1}(s') \cdot \gamma_k(s', s) \cdot \beta_k(s)$$

$$\approx \max_{\substack{(s',s)\\u_k=+1}} (a_{k-1}(s') + c_k(s', s) + b_k(s)) -$$

$$\max_{\substack{(s',s)\\u_k=-1}} (a_{k-1}(s') + c_k(s', s) + b_k(s))$$

where a, b, and c are the respective equivalents of $\alpha$, $\beta$, and $\gamma$ in the log domain.

Similarly, the forward and backward recursions can be simplified as follows:

$$a_k(s) = \max_{s'}(a_{k-1}(s') + c_k(s', s)) \quad (11)$$

$$b_{k-1}(s') = \max_s (b_k(s) + c_k(s', s))$$

As used below, this simplified algorithm will now be referred to as the MAX algorithm.

It is known that a refined approximation (Viterbi) of the MAP algorithm can be used, with performance similar to that of the BCJR algorithm. However, in the present invention, when the proposed simplification is augmented by a correction term, the algorithm becomes equivalent to the ideal log-MAP algorithm. The approximation is the following:

$$\max{}^*(x, y) \stackrel{\Delta}{=} \max(x, y) + \ln(1 + e^{-|x-y|}) \quad (12)$$

The corresponding algorithm will be denoted MAX* algorithm where x and y are branch metric value inputs, and the corresponding equations are as follows:

$$L(\hat{u}_k) \approx \max_{\substack{(s',s)\\u_k=+1}}^* (a_{k-1}(s') + c_k(s', s) + b_k(s)) - \quad (13)$$

$$\max_{\substack{(s',s)\\u_k=-1}}^* (a_{k-1}(s') + c_k(s', s) + b_k(s))$$

$$a_k(s) = \max_{s'}^* (a_{k-1}(s') + c_k(s', s))$$

$$b_{k-1}(s') = \max_s^* (b_k(s) + c_k(s', s))$$

Figure 6:
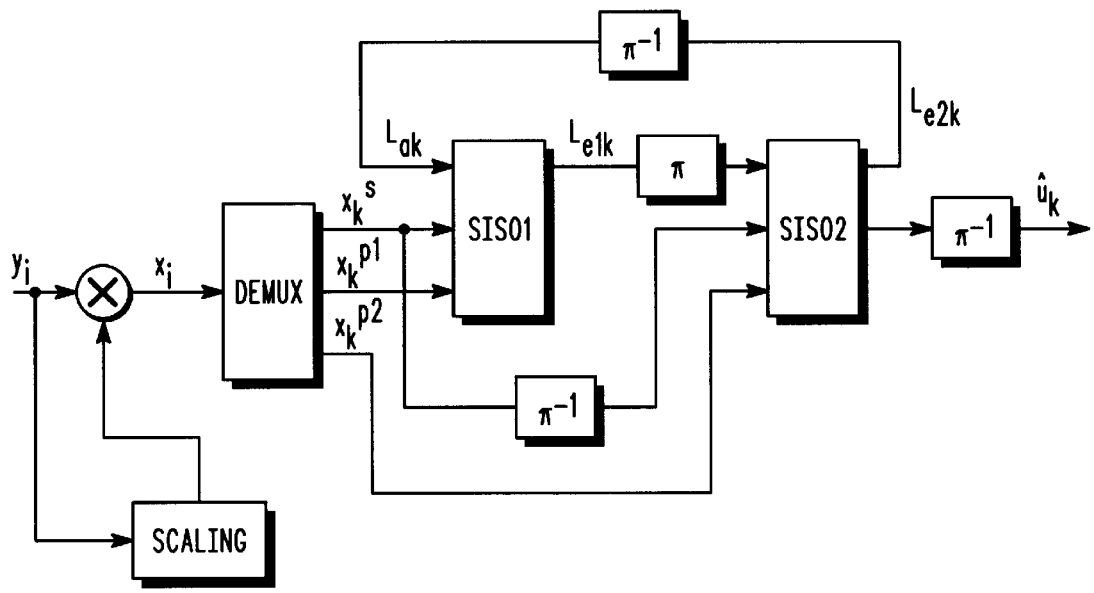
FIG. 6 shows simplified block diagram for the improved decoder, in accordance with the present invention.

A novel aspect of the present invention is to scale a frame of input symbols or data as a whole, using a Root Mean Square (RMS) estimate. A mean is estimated over a whole frame, in order to provide an unbiased estimate. Preferably, the mean is taken over the symbols in the frame. Each symbol is then scaled by the computed frame RMS, before being passed to the turbo decoder, as represented in FIG. 6. In other words, the entire frame is scaled the same amount. The scaling factor is computed as follows:

$$K_{RMS} = \frac{C}{\sqrt{\left(\frac{1}{N}\sum_n^N y_n^2\right) - \bar{y}^2}} \quad (14)$$

Empirical study has shown that a value of about four, for the numerator constant C, provides optimum performance.

EXAMPLE

The scaled input symbols cause the behavior of the iterations of the LLR to approach a final probable value very quickly. As can be seen from simulation results below, this behavior describes the turbo decoding process well. In operation, the iterative loop of the turbo decoder increases the magnitude of the LLR such that the decision error probability will be reduced. The following analysis is presented to show that what the scaling improvement of the present invention does is to improve the decoder performance. Analysis of the incoming samples is also provided with respect to existing turbo coder performance using a conventional Viterbi algorithm.

Figure 7:
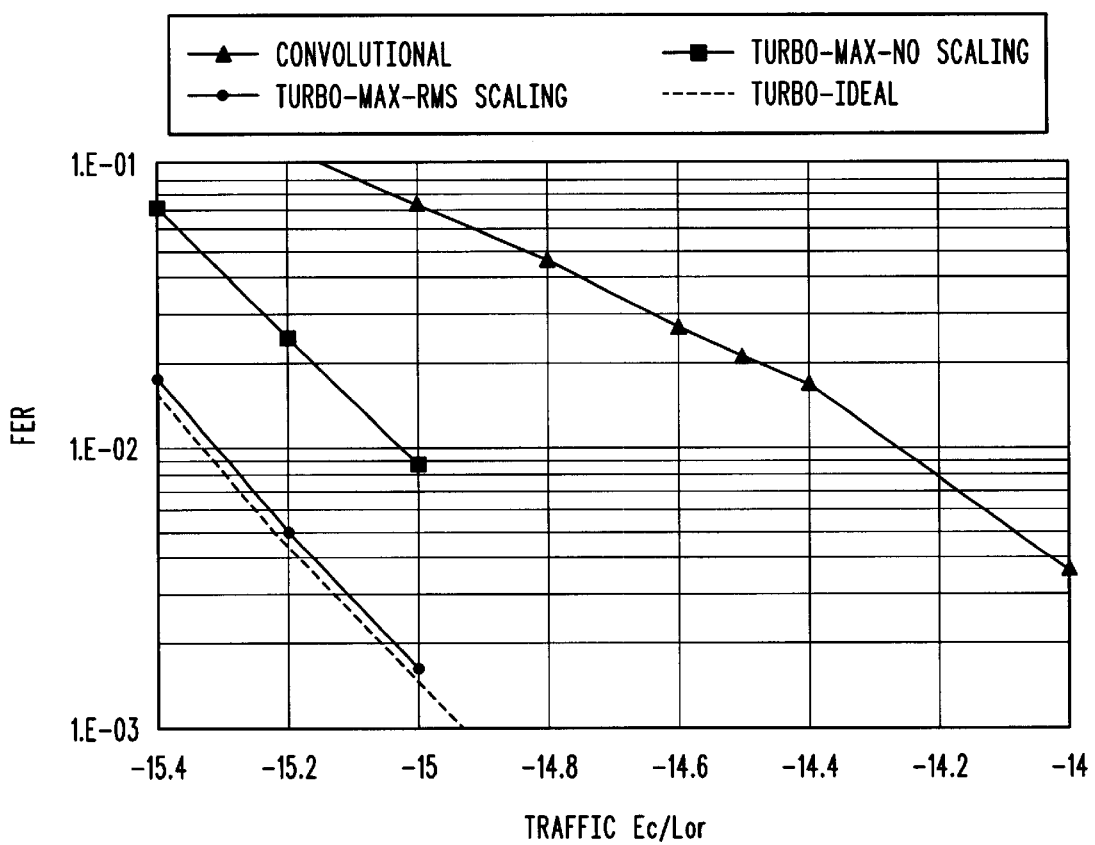
FIGS. 7–9 show graphical representations of the improvement provided by the present invention.
Figure 8:
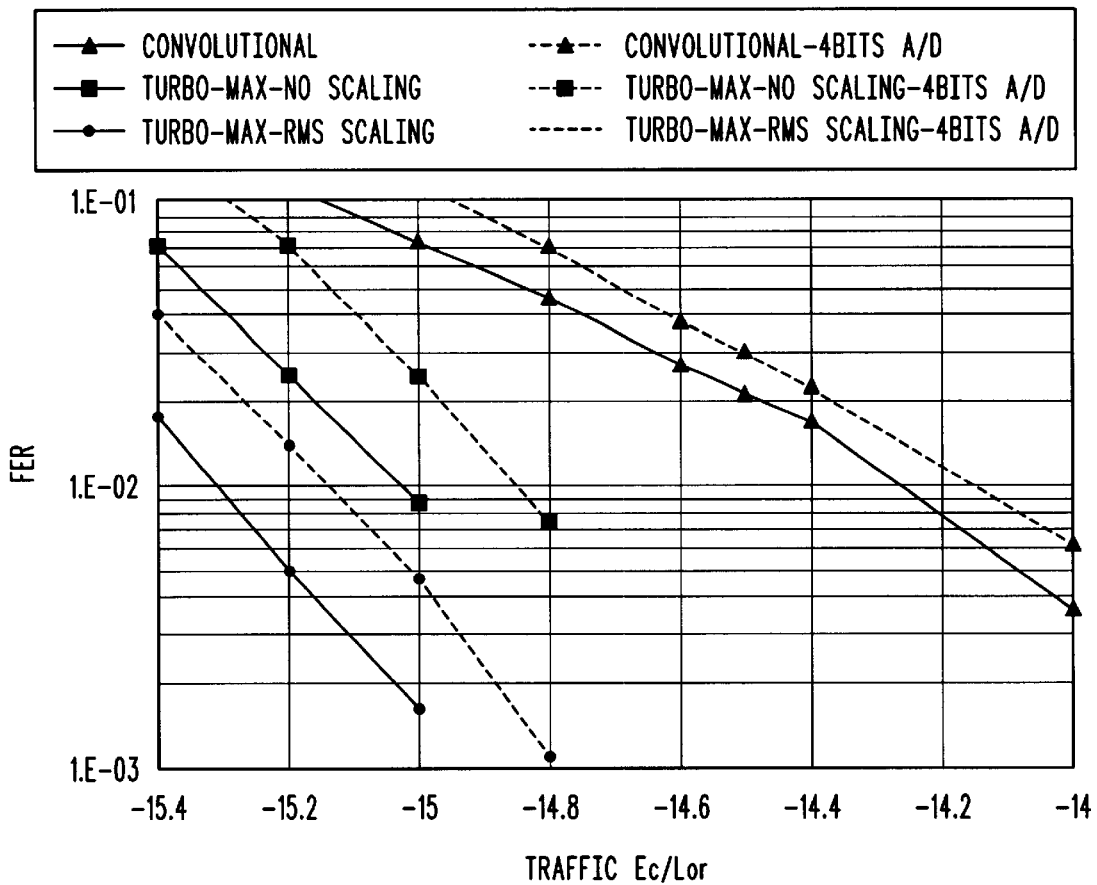
Figure 9:
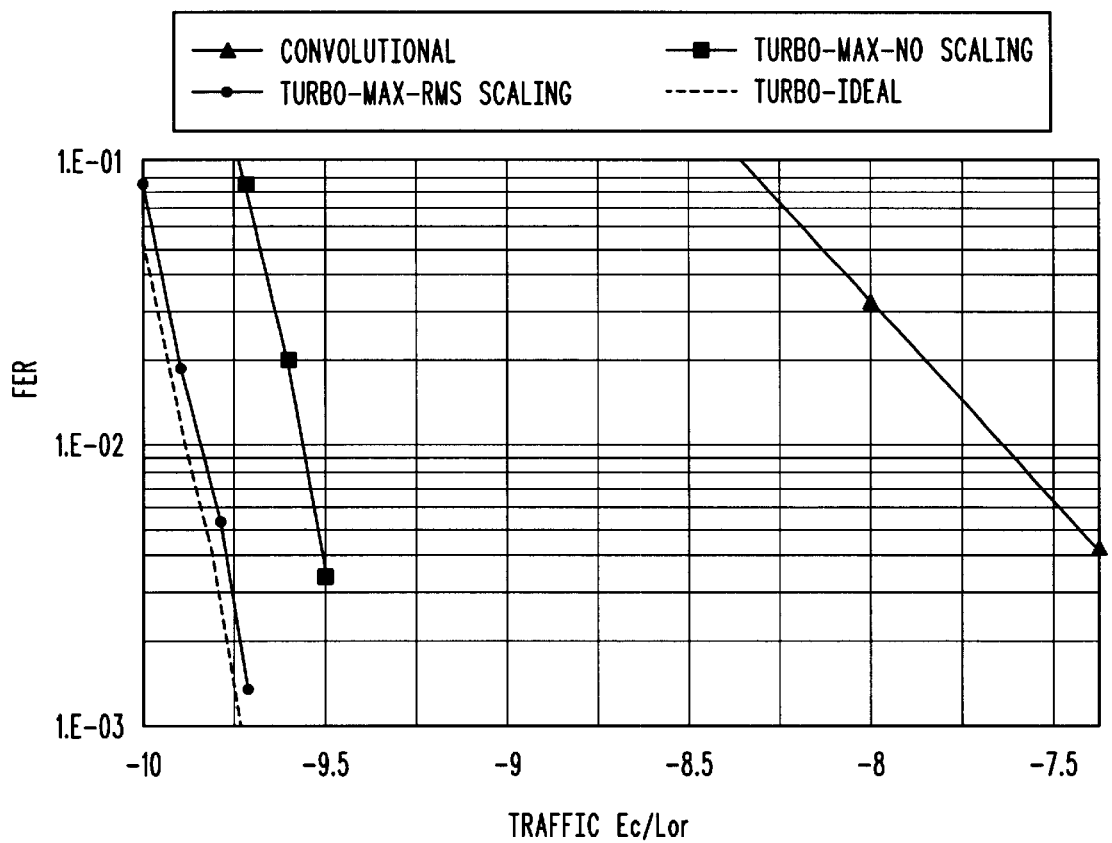

FIG. 7 shows simulation results using the turbo decoding in accordance with the present invention. The code used is the CDMA2000-1x standard code with code rate 1/3, following *Recommended Minimum Performance Requirement for 1.8 and 2 GHz. Code Division Multiple Access (CDMA) Personal Stations,* ANSI J-STD-018, Jan. 16, 1996, with Radio Configuration 4, at 19.2 kbps, using a floating point implementation. As represented in FIGS. 7–9, Traffic Ec/Ior is the ratio of the average transmit energy per PN (pseudo random code) chip for the Forward Traffic Channel to the total transmit power spectral density. Considering an AWGN channel at a Frame Error Rate (FER) of 1%, turbo decoding with ideal knowledge of the channel conditions outperforms conventional Viterbi convolutional coding by 1.05 dB. The performance gain using the frame RMS scaling technique in accordance with the present invention is also about 1.05 dB. MAX decoding without scaling yields a loss of 0.3 dB over ideal turbo decoding. In such channel conditions, MAX* decoding with RMS scaling outperforms greatly any other proposed methods, and exhibits a gain of over 1 dB.

Corresponding results, using a fixed-point demodulator, are presented in FIG. 8. Using 4-bit A/D quantization on the decoder input yields a 0.2 dB additional loss for both MAX and MAX*-scaling techniques, and a 0.15 dB loss for the Viterbi decoder. Using 6-bit quantization induces a degradation of less than 0.05 dB.

In FIG. 9, we show the performance of the technique in AWGN conditions, at high data rate 153.6 kbps. A very large gain is achieved when turbo codes are used. Turbo decoding with ideal knowledge of channel conditions outperforms Viterbi decoding by 2.25 dB, for a 1% target FER. Frame based RMS scaling induces 0.05 dB degradation compared to ideal decoding, achieving therefore a gain of 2.2 dB over conventional Viterbi decoding.

In Rayleigh fading conditions, it is observed that turbo codes significantly outperform convolutional codes as the bit rate increases. At a low bit rate, convolutional codes and turbo codes have similar performance results. However, at a high bit rate, frame RMS scaling combined with MAX* decoding, and MAX decoding without scaling, outperform conventional Viterbi decoding by 1.2 dB and 0.6 dB, respectively.

In summary, for an AWGN channel, turbo decoding using the MAX* algorithm combined with frame RMS scaling provides greatly improved turbo decoding. It performs very closely to ideal turbo decoding that assumes perfect knowledge of the channel characteristics. At low bit rate (19.2 kbps), the performance gain over conventional Viterbi decoding exceeds 1 dB. At high data rate (153.6 kbps), the gain over Viterbi decoding is 2.2 dB. Even without scaling, MAX decoding offers gain improvement over Viterbi decoding of 0.75 dB at 19.2 kbps, and 1.9 dB at 153.6 kbps.

As should be recognized, the hardware needed to implement the input data scaling is extremely simple, and can be implemented with some simple attachment to the existing design and is very suitable for a DSP implementation.

Figure 10:
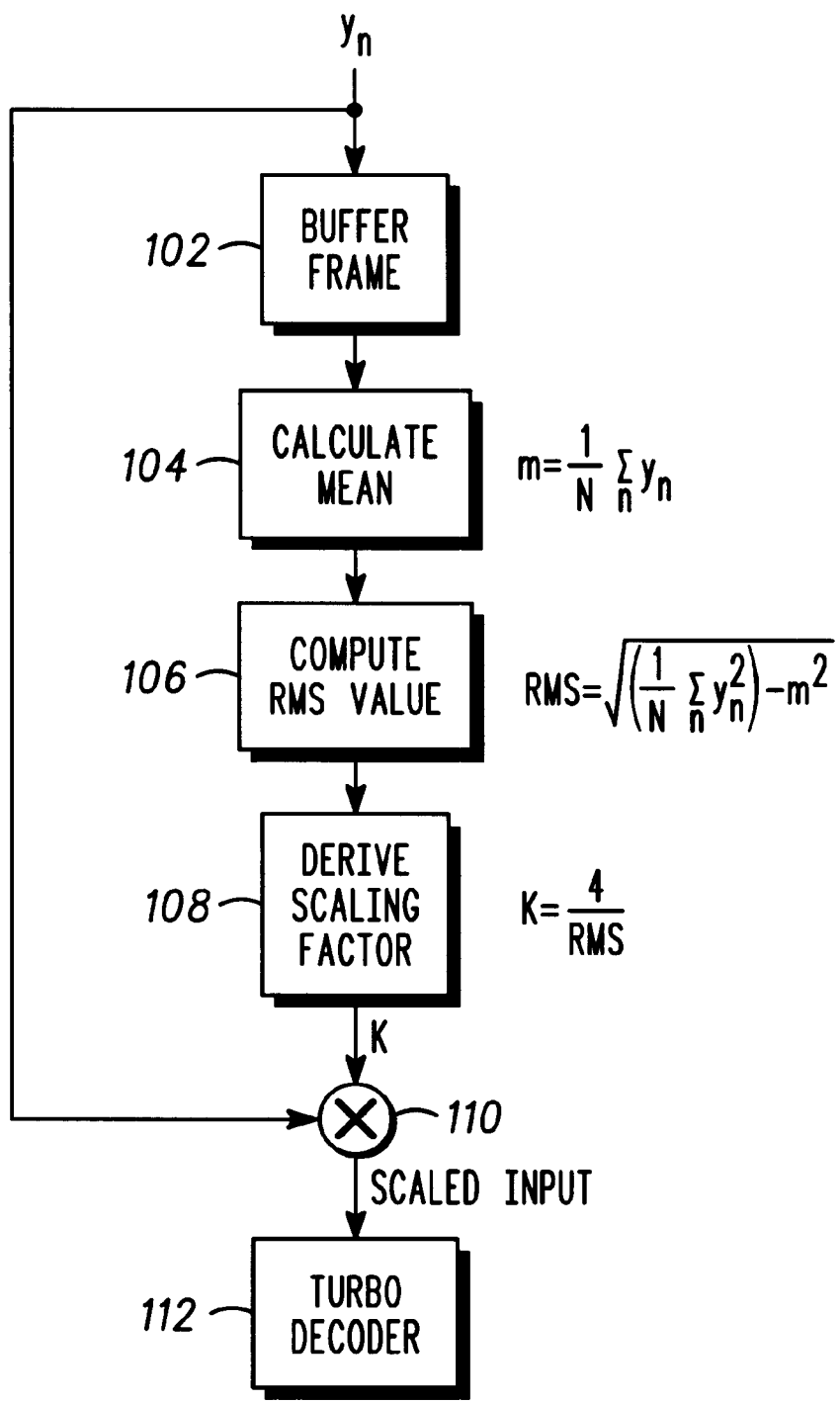
FIG. 10 shows a method for improved turbo decoding, in accordance with the present invention.

FIG. 10 shows a flow chart representing a method 100 for improved decoding of received convolutionally coded input data uses data scaling to provide near ideal turbo decoding. The method includes a first step of loading 102 a portion of the input data into a buffer. Preferably, the portion is a frame of input data. A next step includes calculating 104 a mean of the data in the portion of the input data. A next step includes computing 106 a root-mean-square value of the portion of the input data using the mean from the calculating step. A next step includes deriving 108 a scaling factor from the root-mean-square value of the computing step, and a next step includes scaling 110 the portion of input data by the scaling factor of the deriving step. The scaled data is then sent to the turbo decoder for decoding.

In a preferred embodiment, the above steps are repeated until all the input data is decoded. In addition, the calculating step includes calculating a symbol mean of the symbols on of the input data. In implementing the MAX* function, the calculating step includes calculating a maximum value for the forward recursion, backward recursion, and branch state metric. More preferably, the calculating step includes approximating each maximum value by replacing every sum of exponentials with the leading term of that sum of exponentials in the associated forward recursion, backward recursion, and branch state metric. This is best done in the log domain.

While specific components, functions and methodology of turbo decoding convolutional codes are described above, fewer or additional functions could be employed by one skilled in the art and be within the broad scope of the present invention. The invention should be limited only by the appended claims.

What is claimed is:

1. A method for improving the decoding of received convolutionally coded input data using data scaling, the method comprising the steps of:

loading a portion of the input data into a buffer;

calculating a mean of the data in the portion of the input data;

computing a root-mean-square value of the portion of the input data using the mean from the calculating step;

deriving a scaling factor from the root-mean-square value of the computing step;

scaling the portion of input data by the scaling factor of the deriving step;

sending the scaled data to a turbo decoder for decoding; and decoding the scaled data from the scaling step.

2. The method of claim 1, wherein the portion of the loading step is a frame of input data.

3. The method of claim 1, further comprising the step of repeating all the previous steps for all of the input data.

4. The method of claim 1, wherein the calculating step includes calculating a symbol mean of the symbols on of the input data.

5. The method of claim 1, wherein the calculating step includes calculating a maximum value for the forward recursion, backward recursion, and branch state metric.

6. The method of claims 5, wherein the calculating step includes approximating each maximum value by replacing every sum of exponentials with the leading term of that sum of exponentials in the associated forward recursion, backward recursion, and branch state metric.

7. The method of claim 6, wherein the calculating step includes the maximum values being determined in the log domain.

8. A method for improving the decoding of received convolutionally coded input data using data scaling, the method comprising the steps of:

loading a frame of the input data into a buffer;

calculating a mean of the data in the frame of the input data;

computing a root-mean-square value of the frame of the input data using the mean from the calculating step;

deriving a scaling factor from the root-mean-square value of the computing step;

scaling the frame of input data by the scaling factor of the deriving step;

sending the scaled data to a turbo decoder for decoding;

decoding the scaled input data from the scaling step; and repeating the previous steps until all the input data is decoded.

9. The method of claim 8, wherein the calculating step includes calculating a symbol mean of the symbols on of the input data.

10. The method of claim 8, wherein the calculating step includes calculating a maximum value for the forward recursion, backward recursion, and branch state metric.

11. The method of claim 10, wherein the calculating step includes approximating each maximum value by replacing every sum of exponentials with the leading term of that sum of exponentials in the associated forward recursion, backward recursion, and branch state metric.

12. The method of claim 11, wherein the calculating step includes the maximum values being determined in the log domain.

* * * * *